United States Patent
Whetsel

(10) Patent No.: US 7,441,170 B2
(45) Date of Patent: Oct. 21, 2008

(54) EXTERNAL SCAN CIRCUITRY CONNECTED TO LEADS EXTENDING FROM CORE CIRCUITRY

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 151 days.

(21) Appl. No.: 11/380,965

(22) Filed: May 1, 2006

(65) Prior Publication Data

US 2006/0242512 A1 Oct. 26, 2006

Related U.S. Application Data

(62) Division of application No. 10/705,648, filed on Nov. 10, 2003, now Pat. No. 7,065,692, which is a division of application No. 09/812,220, filed on Mar. 19, 2001, now Pat. No. 6,658,615, which is a division of application No. 09/107,105, filed on Jun. 30, 1998, now Pat. No. 6,223,315.

(60) Provisional application No. 60/051,377, filed on Jun. 30, 1997.

(51) Int. Cl.
*G01R 31/28* (2006.01)

(52) U.S. Cl. .................................. 714/727; 714/729
(58) Field of Classification Search ................. 714/727, 714/726, 729, 733; 324/158.1; 84/746, 748
See application file for complete search history.

(56) References Cited

U.S. PATENT DOCUMENTS

| | | | | | |
|---|---|---|---|---|---|
| 5,396,501 | A | * | 3/1995 | Sengoku | 714/727 |
| 5,544,174 | A | * | 8/1996 | Abend | 714/726 |
| 5,673,276 | A | * | 9/1997 | Jarwala et al. | 714/727 |
| 5,744,949 | A | * | 4/1998 | Whetsel | 324/158.1 |
| 5,862,152 | A | * | 1/1999 | Handly et al. | 714/727 |
| 5,900,573 | A | * | 5/1999 | Barnes | 84/746 |
| 6,223,315 | B1 | | 4/2001 | Whetsel | |
| 6,658,615 | B2 | | 12/2003 | Whetsel | |
| 7,065,692 | B2 | | 6/2006 | Whetsel | |

* cited by examiner

*Primary Examiner*—David Ton
(74) *Attorney, Agent, or Firm*—Lawrence J. Bassuk; W. James Brady; Frederick J. Telecky, Jr.

(57) ABSTRACT

An integrated circuit carries an intellectual property core. The intellectual property core includes a test access port 39 with test data input leads 15, test data output leads 13, control leads 17 and an external register present, ERP lead 37. A scan register 25 encompasses the intellectual property core and ERP lead 37 carries a signal indicating the presence of the scan register.

4 Claims, 4 Drawing Sheets

EXTERNAL SCAN CIRCUITRY CONNECTED TO LEADS EXTENDING FROM CORE CIRCUITRY

This application is a divisional of application Ser. No. 10/705,648, filed Nov. 10, 2003, now U.S. Pat. No. 7,065, 692, issued Jun. 20, 2006;

which was a divisional of application Ser. No. 09/812,220, filed Mar. 19, 2001, now U.S. Pat. No. 6,658,615; which was a divisional of application Ser. No. 09/107,105, filed Jun. 30, 1998, now U.S. Pat. No. 6,223,315;

which claims priority from Provisional Application 60/051, 377, filed Jun. 30, 1997.

FIELD OF THE INVENTION

The invention relates generally to testing of integrated circuits having embedded cores and, more particularly, to a core design that efficiently supports a user-added scan register option.

BACKGROUND OF THE INVENTION

Rapid design and deployment of high complexity integrated circuits (IC) can be achieved by reuse of preexisting intellectual property (IP) cores, such as digital signal processors, microcontrollers, processors, I/O peripherals, and memory. Such IP cores are discussed in "Blocking in a System on a Chip", by Hunt and Rowson, published in the November 1996 edition of IEEE Spectrum and incorporated herein by reference. Marketing of IP cores, as a way to expedite the fabrication of highly complex system chips, changes the way the cores are designed for testability. Typically, most IP cores were first designed as stand alone ICs to be used on a circuit board. With today's advanced IC fabrication technology, it is possible to migrate what was once a circuit board of plural ICs into a single IC comprising plural cores embedded therein. Thus a transition from IC to embedded IP core is a technology trend.

Many of the same testing problems currently seen in circuit boards designed with multiple ICs will be seen in ICs designed with multiple cores.

The use of IC resident testability standard, IEEE Std 1149.1, incorporated herein by reference, has proven to be effective in resolving most test problems related to testing ICs and the interconnections between ICs at the circuit board level. This standard should be effective in resolving problems related to testing cores and the interconnections between cores at the IC level as well.

FIG. 1 illustrates the architecture of IEEE Std. 1149.1 implemented in a conventional IC. The architecture includes (1) a test access port (TAP) 11 which further comprises a TAP controller and an instruction register, (2) a plurality of test data registers (boundary scan register and others), and (3) an 1149.1 test port interface which provides external I/O to the architecture via the TAP controller. These elements and their operation and function are well known and described in IEEE Std. 1149.1. The boundary scan register includes a scan cell at each input, output, control, and input/output pin of the IC.

In normal mode, the IC operates normally to internally process and externally communicate signals to other ICs via the transparent boundary scan register. In a first test mode, the functional circuitry of the IC is disabled and the boundary scan register is accessed and controlled, via TAP signal lines at 13, 15 and 17, to communicate external test signals between ICs to verify their interconnectivity. This external interconnect test mode is invoked by scanning an 1149.1 Extest instruction into the instruction register of the TAP 11. In another test mode, the IC's functional circuitry may be functionally disabled but configured to be testable via scan access (from the TAP) to one or more of the test data registers. Instructions scanned into the instruction register of the TAP are used to connect the TAP up to a selected test data register (s), i.e. the boundary scan register and/or internal test data registers, so that serial test data can be input and output to the register to effectuate a given test or other type of operation. For example; when the Extest instruction is loaded into the instruction register, the TAP selects and connects up to the boundary scan register via its serial input 15, serial output 13, and control signals 17. Once connected, the TAP responds to the external test port signal pins of the IC to output control to the boundary scan register to communicate test data to the boundary scan register to execute interconnect testing. Similarly, other instructions can be loaded that allow the TAP to select and connect up to other test data registers so that other types of operations such as; internal scan testing, built in self test triggering (1149.1 Runbist instruction), or IC serial bypassing (1149.1 Bypass instruction), can be performed.

While the complete 1149.1 architecture of FIG. 1 is almost always implemented in ICs to provide the external and internal testing mentioned above, it may not be completely implemented in an IP core version of an IC. More specifically, the boundary scan register portion of the architecture may not be implemented in IP cores because competition between IP core venders is largely based on IP core performance, and the boundary scan register inherently adds a disadvantageous delay (through a switch or multiplexer) to each input, output, and control (e.g. three-state control) signal associated with the IP core's boundary. A boundary scan register that is provided as part of an IP core will herein be termed a core-provided boundary scan register. An IP core having its own core-provided boundary scan register has the same general structure as the IC of FIG. 1.

If an IP core provider does not implement the boundary scan register due to performance considerations, and if the core itself cannot be modified by the user (i.e. a hard core), then the IP core user will have to add a TAP and boundary scan register around the IP core if the user wishes to achieve interconnect testing via boundary scan. Surrounding an IP core with a TAP and boundary scan register for the purpose of isolating the IP core and performing interconnect testing between the IP core and other IP cores is a known prior art technique and is illustrated in FIG. 2.

Within the broken-line box of FIG. 2 is an IP core with appropriate 1149.1 architecture, but without the boundary scan register and associated signal lines 13, 15 and 17 of FIG. 1. A user-added boundary scan register 25 and TAP 23 are shown outside the broken-line box. The boundary scan register 25 is unshaded to distinguish it from the core-provided boundary scan register of FIG. 1. The TAP 23 is provided by the user to access and control the user-provided boundary scan register 25 and is separate from the TAP 21 of the IP core. The TAP 21 differs from TAP 11 and TAP 23 because TAP 21 does not support conventional 1149.1 boundary scan instructions, namely Extest and Sample/Preload. The approach shown in FIG. 2 disadvantageously requires adding TAP 23 to provide access to and control of the user-added boundary scan register. Also, the user must be able to select either the TAP 21 for internal testing/emulation of the IP core, or the TAP 23 for interconnect testing (via the boundary scan register) between the IP core and other IP cores or circuits residing in the IC.

It is therefore desirable to permit the user to add boundary scan to an IP core without the overhead associated with adding a separate TAP to control boundary scan.

The invention permits reuse of the IP core's TAP to access a user-added boundary scan register.

DETAILED DESCRIPTION OF THE INVENTION

Figure 1:
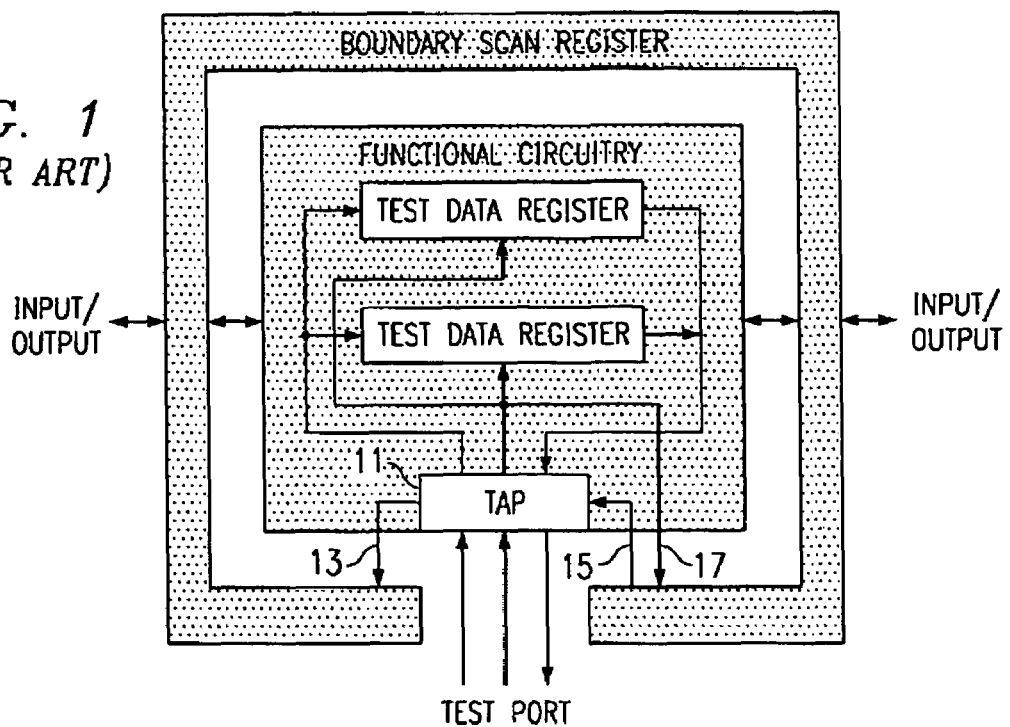
FIG. 1 illustrates a conventional integrated circuit with 1149.1 boundary scan capability, or alternatively, a conventional IP core with core-provided 1149.1 boundary scan capability.
Figure 3:
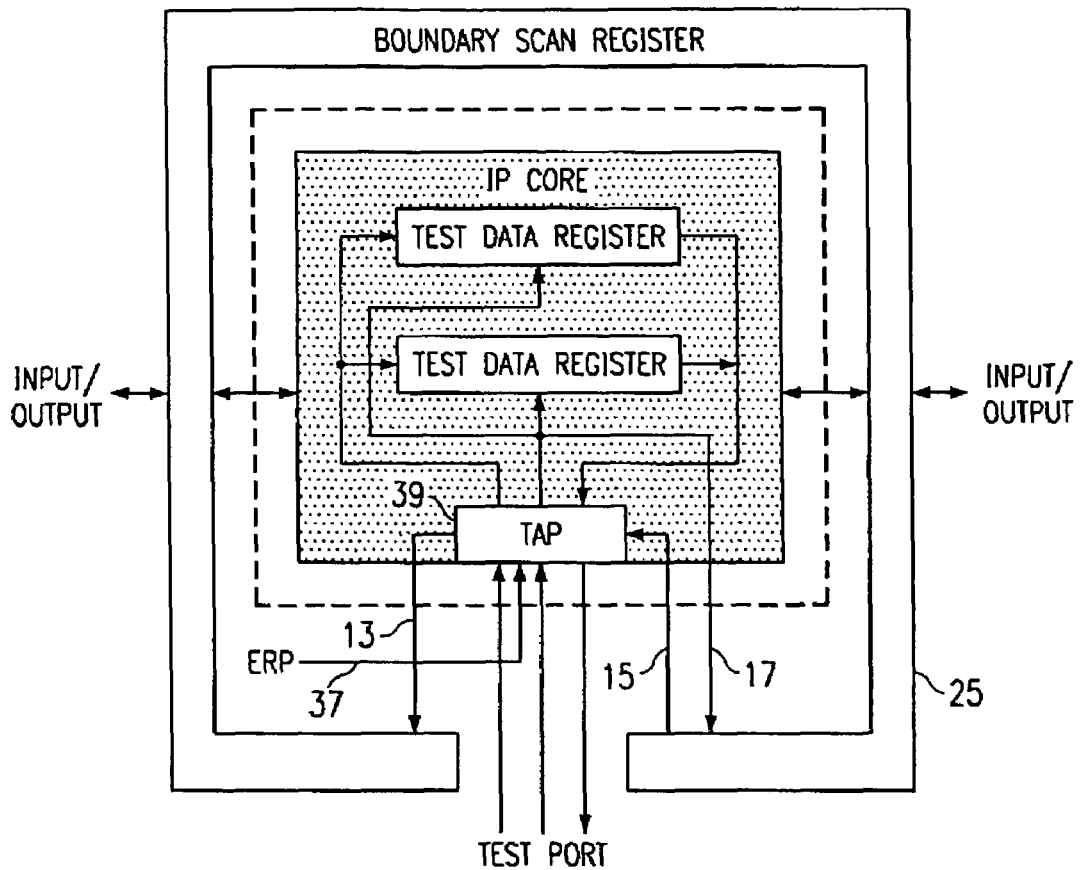
FIG. 3 illustrates an IP core with user-added boundary scan according to the present invention.

Example FIG. 3 illustrates, within the broken-line box, an IP core without a boundary scan register but having the necessary access and control lines for connection to a user-added scan register. In example FIG. 3, it is seen that the TAP 39 of the IP core provides signal lines 13, 15 and 17 for accessing and controlling a user-added scan register 25. In this example, the user-added scan register is a boundary scan register (shown unshaded to distinguish from the core-provided boundary scan register of FIG. 1). The TAP 39 also includes an external register present (ERP) input 37 for indicating to the TAP whether or not a user-added scan register has been implemented.

Figure 2:
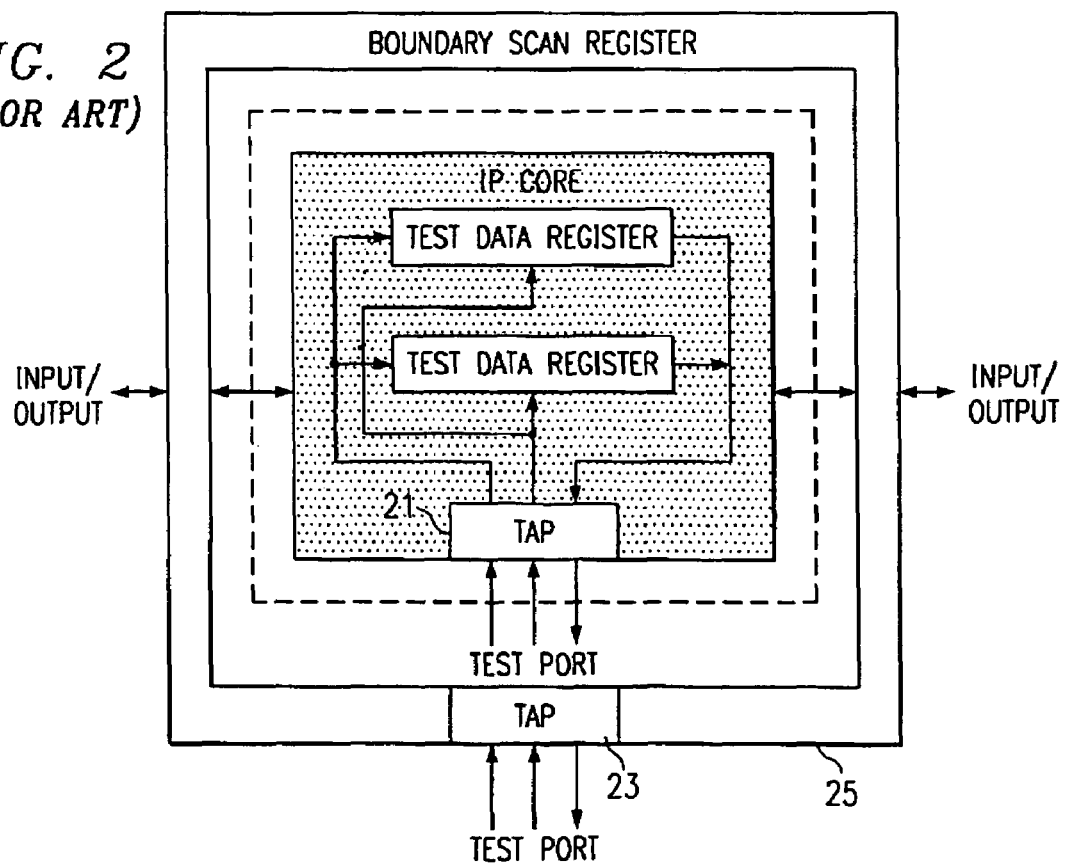
FIG. 2 illustrates the conventional configuration of an IP core with user-added boundary scan.
Figure 4:
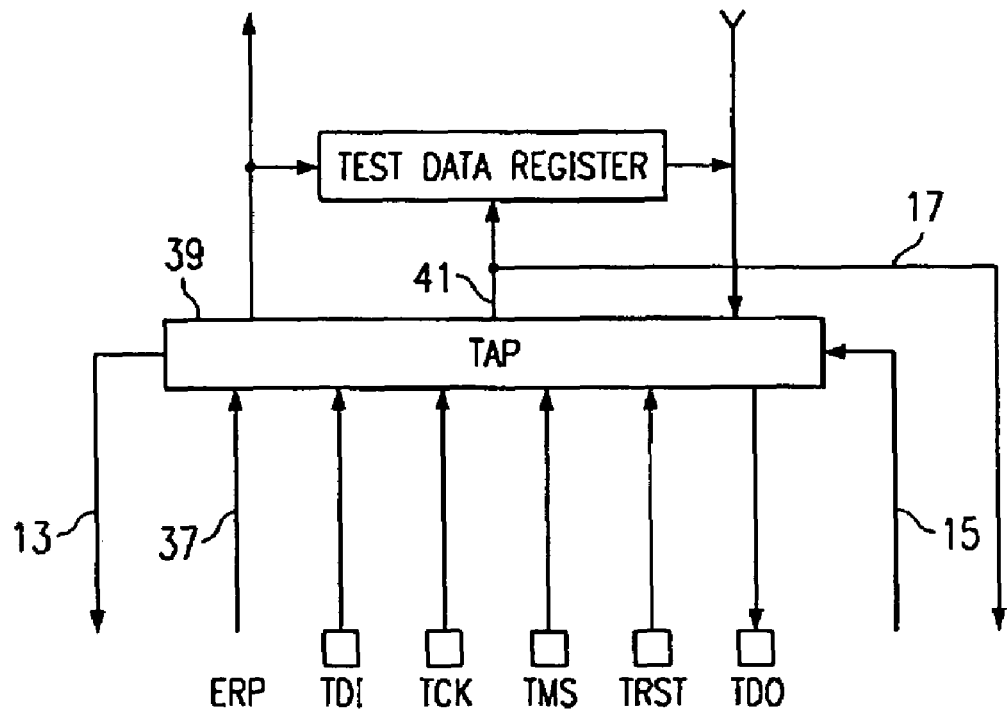
FIG. 4 illustrates in greater detail the TAP control signals of FIGS. 3 and 3A.

Example FIG. 4 shows in more detail the IP core TAP 39 of FIG. 3, which includes the conventional 1149.1 test port signals of TAP 21 (see FIG. 2), namely test data input (TDI), test clock (TCK), test mode select (TMS), test reset (TRST), and test data output (TDO), along with the additional signal lines 13, 15, 17 and 37 which are added to allow the TAP 39 to access and control the user-implemented boundary scan register. Control output from the instruction register of TAP 39 is shown at 41. FIG. 4 shows that the aforementioned conventional 1149.1 test port signals are accessible at the external terminals of the IC.

In addition to providing the additional external signals mentioned above, the IP core provider must design the instruction register of the TAP 39 to include all required 1149.1 instructions that are used by TAP 11 (see FIG. 1) to access and control a core-provided boundary scan register. The required 1149.1 boundary scan instructions are the Extest and Sample/Preload instructions. Also, the IP core provider must design the instruction register of the TAP 39 to control the user-added boundary scan register 25 exactly like a core-provided boundary scan register would be controlled by TAP II under the influence of other required instructions (e.g. conventional Bypass instruction), optional instructions (e.g. conventional Intest, HighZ, Clamp, Runbist, IDcode, and Usercode instructions), or proprietary IP core vendor-specific instructions.

During a conventional Extest instruction, the conventional TAP 11 (see FIG. 1) inhibits the operation of the IP core, connects the boundary scan register to the IC's TDI and TDO pins, and controls the boundary scan register to perform interconnect testing.

During a conventional Sample/Preload instruction, the conventional TAP 11 enables the operation of the IP core, connects the boundary scan register to the IC's TDI and TDO pins, and controls the boundary scan register to be transparent, while functional signals flowing through the boundary scan register are captured and shifted out for inspection.

During a conventional Bypass instruction, the conventional TAP 11 enables the operation of the IP core, connects the internal Bypass register (an 1149.1 defined single bit test data register) to the IC's TDI and TDO pins, and controls the boundary scan register to be transparent.

During a conventional Intest instruction, the conventional TAP 11 adapts the IP core for testing, connects the boundary scan register to the IC's TDI and TDO pins, and controls the boundary scan register to perform testing on the IP core.

During a conventional HighZ instruction, the conventional TAP 11 inhibits the operation of the IP core, connects the internal Bypass register to the IC's TDI and TDO pins, and controls the boundary scan register outputs to the high impedance state.

During a conventional Clamp instruction, the conventional TAP 11 inhibits the operation of the IP core, connects the internal Bypass register to the IC's TDI and TDO pins, and controls the boundary scan register to a predetermined static input/output condition.

During a conventional Runbist instruction, the conventional TAP 11 adapts the IP core for BIST testing, connects to the IC's TDI and TDO pins a specified internal test data register that will be used to access the pass/fail status of the BIST operation, and controls the boundary scan register to a predetermined static input/output condition.

During a conventional IDcode instruction, the conventional TAP 11 enables the operation of the IP core, connects the internal IDcode register (an 1149.1 specified 32-bit register for outputting vendor identification and other information) to the IC's TDI and TDO pins, and controls the boundary scan register to be transparent.

During a conventional Usercode instruction, the conventional TAP 11 enables the operation of the IP core, connects the internal Usercode register (an 1149.1 specified register for outputting additional vendor information) to the IC's TDI and TDO pins, and controls the boundary scan register to be transparent.

With an IP core that provides the signals and instructions as described above, a user of the IP core need only design a boundary scan register around the IP core and connect the core-provided signal lines 13, 15 and 17 to the user-added boundary scan register to achieve full 1149.1 test capability, including boundary scan test capability. This approach is good for the IP core provider in that, while it supports full 1149.1 test capability, it does not require the IP core provider to degrade performance by providing a boundary scan register in the IP core itself. The approach is good for the user of the IP core in that it allows the user (e.g. an ASIC manufacturer) to decide whether to add the boundary scan register and the attendant performance consequences. Also the ease of upgrading to full 1149.1 boundary scan testing by simply making connections between the IP core's TAP and a user-added boundary scan register is a bonus for IC synthesis tool providers since the process can be advantageously automated to push button placement and routing.

Figure 5:
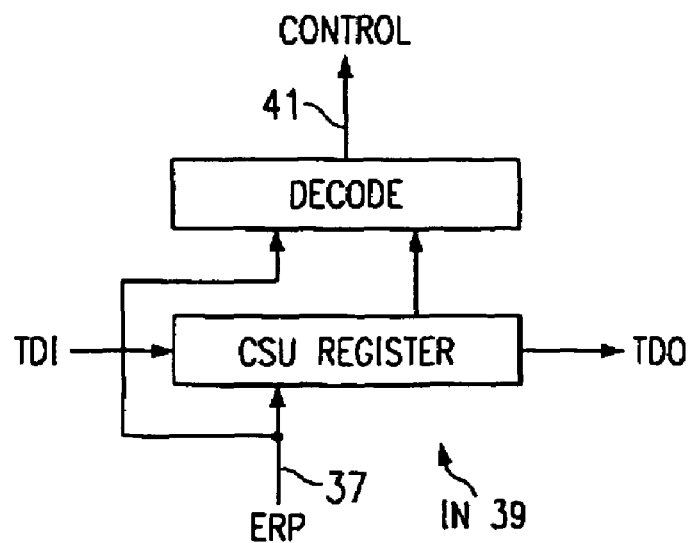
FIG. 5 illustrates the structure of the instruction register in the TAP of FIGS. 3, 3A and 4.

In example FIG. 5 it is seen that the 1149.1 instruction register within the IP core TAP comprises a capture-shift-update (CSU) register section and a decode section. During conventional 1149.1 instruction scans, the CSU register section captures status information present on its parallel inputs and then shifts data from TDI to TDO. During the shift operation, the captured status information is shifted out as a new instruction is shifted in. At the end of the 1149.1 instruction scan, the new instruction shifted into the CSU register is updated and input to the decode section. The decode section decodes the new instruction and outputs control to cause the new instruction to take effect. The instruction can be, for example, any of the types previously mentioned.

When a user decides to connect a boundary scan register to an IP core TAP having the external signal connections 13, 15 and 17 shown in FIGS. 3 and 4, the user sets the external register present (ERP) signal to a logic state indicative of the presence of the user-added boundary scan register. In this example, a high on ERP indicates the presence of a user-added boundary scan register, and a low on ERP indicates the absence of a user-added boundary scan register. As seen in FIG. 5, the ERP signal is input to both the instruction CSU register and decode sections. The ERP is a status input (i.e. a capture input) to the CSU register section. The ERP is an additional decode input to the decode section.

During instruction scan operations, the ERP signal is captured and shifted out of the CSU register, along with other status inputs. By examining the ERP signal scanned from the CSU register, it is possible to determine whether or not the user added a boundary scan register to the IP core (for example ERP high=added, ERP low=not added). So the ERP input to the instruction CSU register allows a user of the IC (e.g. a system designer) to determine the presence or absence of a user-added boundary scan register.

If the ERP is set high, indicating the presence of a user-added boundary scan register, the decode section responds conventionally to 1149.1 instructions that access and/or control the boundary scan register. On the other hand, if the ERP is set low, indicating the absence of a user-added boundary scan register, the decode section will preferably cause all 1149.1 instructions that normally access and/or control the boundary scan register to default to being Bypass instructions. This would mean that Extest, Intest, Sample/Preload, HighZ, and Clamp instructions all default to the Bypass instruction when ERP is low. Defaulting to the Bypass instruction is preferred because that is the default instruction that 1149.1 conventionally uses for unknown/undefined instructions scanned into the instruction register.

Figure 3A:
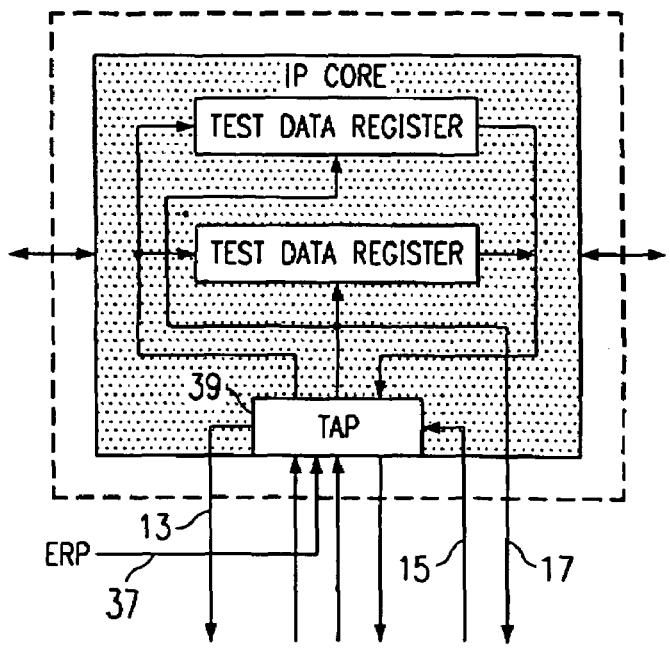
FIG. 3A illustrates an IP core arranged to support a user-added boundary scan register according to the present invention.

FIG. 3A shows only the IP core within the broken-line box of FIG. 3, as it would be provided by the IP core vendor, that is, with core-provided signal lines 13, 15 and 17 arranged to be available for convenient connection as desired to a user-added scan register, and with the core-provided ERP line 37 arranged to be available for convenient connection to an appropriate logic level. If the core user does not add a boundary scan register, then lines 13, 15 and 17 will remain unconnected when the core is embedded in an IC.

Figure 6:
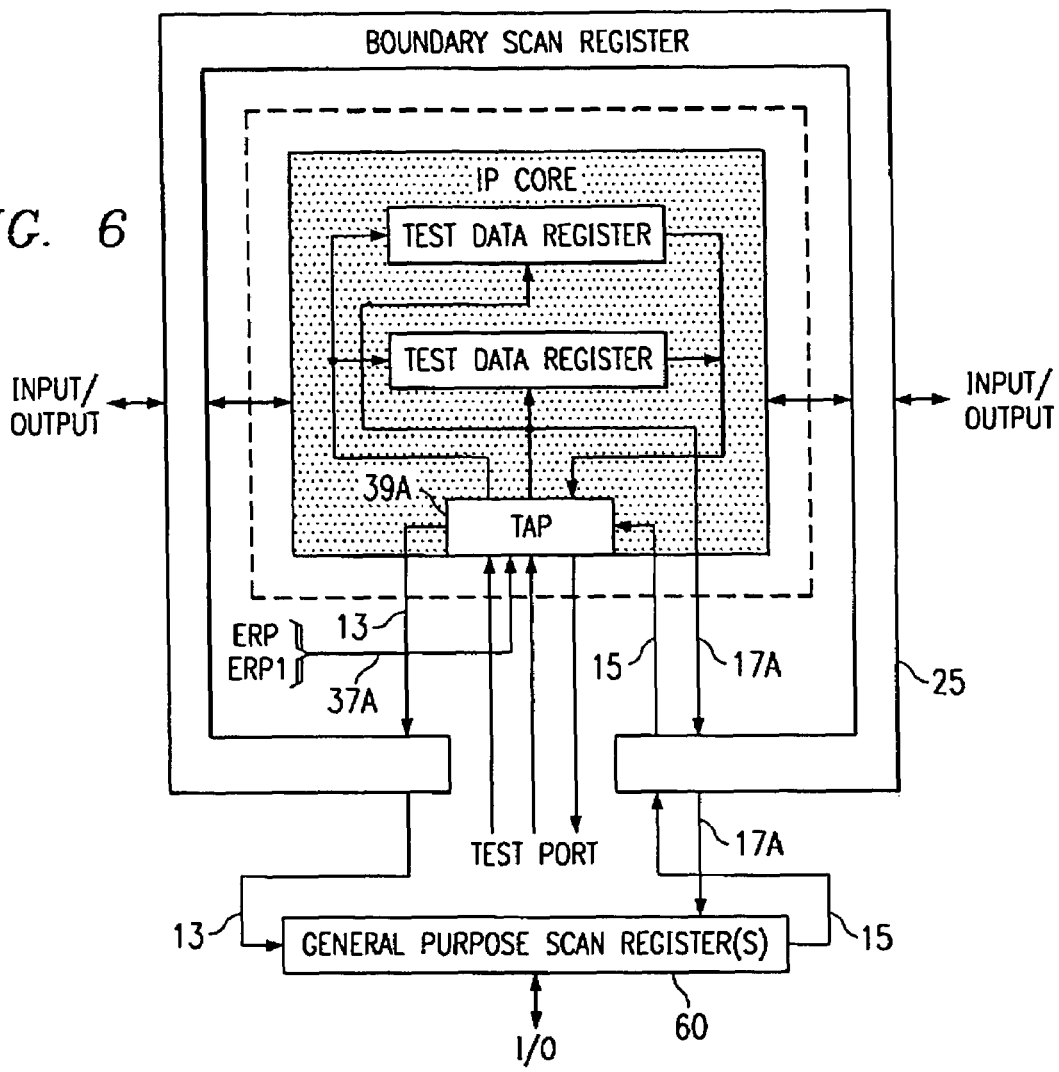
FIG. 6 is similar to FIG. 3 and illustrates another user-added scan register according to the invention.

Example FIG. 6 is similar to FIG. 3, but includes a further user-added scan register. In example FIG. 6, a user-added general purpose scan register 60 is shown interfaced to the IP core, in addition to the previously described user-added boundary scan register 25. In such instances, an additional signal indicates to TAP 39A the presence or absence of the additional scan register, and the control lines at 17A provide control from TAP 39A to the scan register 60 as well as to register 25. The scan input 15 and scan output 13 are used to access either the boundary scan or general purpose scan register. In FIG. 6, ERP is used, as previously described, to indicate the presence or absence of the boundary scan register, and to enable access of the boundary scan register if it is present, or default to the bypass instruction if it is not present. Likewise, the ERP1 signal is used to enable access of the general purpose scan register if it is present, or to default to the bypass instruction if it is not present and access of it is attempted. The ERP and ERP1 signals are designated generally at 37A in FIG. 6. Scan access to plural user-added scan registers operates the same as conventional 1149.1 scan access to plural core-provided scan registers.

The user-added scan register(s) at 60 are located in the IC physically outside of the core's boundary, that is, external relative to the core. The general purpose scan register 60 can be any scan register that does not perform boundary scan functions relative to the core boundary of FIG. 6. Thus, scan register 60 could even have the same structure as boundary scan register 25, but would not function as a boundary scan register relative to the core boundary. Also, the core design can provide for addition of as many user-added scan registers as desired. In the arrangement of FIG. 6, the IP core user can easily control and access a user-added scan register other than a user-added boundary scan register. User-added scan registers (such as 60) for general purpose scan based input/output (110), via a core resident TAP, could serve many applications inside a system-on-a-chip such as expanded testing of circuits external to the core, user defined chip status bit monitoring, user defined chip control bit settings, and programming of electrically programmable circuits inside the chip.

Figure 6A:
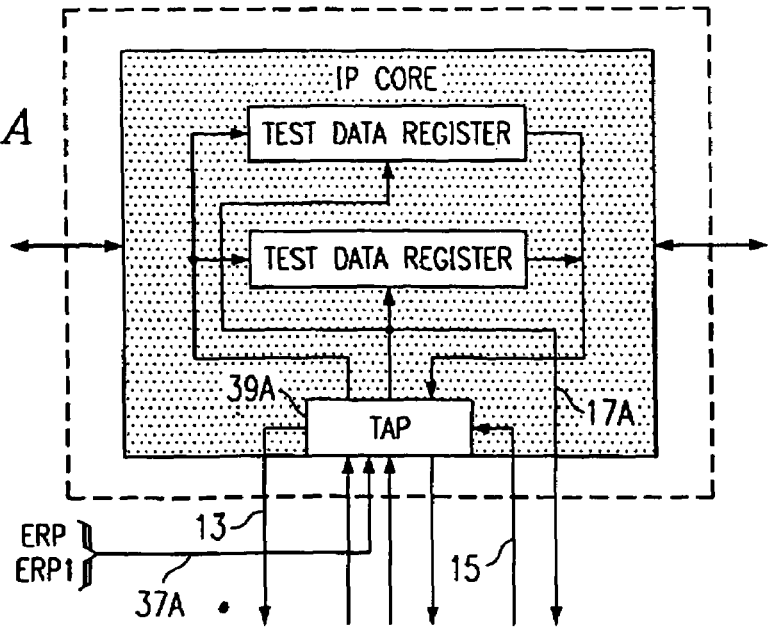
FIG. 6A is similar to FIG. 3A and illustrates an IP core arranged to support the user-added scan registers of FIG. 6.

FIG. 6A relates to FIG. 6 as FIG. 3A relates to FIG. 3, showing only the FIG. 6 IP core as it would be provided by the IP core vendor.

Although exemplary embodiments of the present invention are described above, this description does not limit the scope of the invention, which can be practiced in a variety of embodiments.

I claim:

1. An integrated circuit comprising:
   A. core circuitry having a periphery and having, extending beyond the periphery of the core circuitry, functional input leads, functional output leads, a test data input lead, a test data output lead, a test clock input lead, a test mode select input lead, an external register present input lead, an external test data output lead, an external test data input lead, and external register control output leads; and
   B. a scan circuitry external of the periphery of the core circuitry and connected to the functional input leads, the functional output leads, the external test data output lead, the external test data input lead, and the external register control output leads, the scan circuitry being free of test access port circuitry external of the periphery of the core circuitry.

2. The integrated circuit of claim 1 in which the core circuitry is free of boundary scan circuitry coupled to the test data input lead and the test data output lead.

3. The integrated circuit of claim 1 in which the core circuitry includes test data registers coupled to the test data input lead and the test data output lead.

4. The integrated circuit of claim 1 in which the scan circuitry is boundary scan circuitry.

* * * * *